United States Patent
Olarig

[11] Patent Number: 6,038,680
[45] Date of Patent: *Mar. 14, 2000

[54] FAILOVER MEMORY FOR A COMPUTER SYSTEM

[75] Inventor: Sompong Paul Olarig, Cypress, Tex.

[73] Assignee: Compaq Computer Corporation, Houston, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/763,411

[22] Filed: Dec. 11, 1996

[51] Int. Cl.[7] ................................................. G06F 11/00
[52] U.S. Cl. ................................................................ 714/6
[58] Field of Search ..................... 395/182.04, 182.05, 395/182.06, 183.18, 185.1; 371/10.2, 10.3; 711/114, 162; 714/6, 7, 8, 42, 710, 711

[56] References Cited

U.S. PATENT DOCUMENTS

| | | | |
|---|---|---|---|
| 5,177,744 | 1/1993 | Cesare et al. | 395/182.04 |
| 5,200,959 | 4/1993 | Gross et al. | 395/182.06 |
| 5,267,242 | 11/1993 | Lavellee et al. | 395/182.05 |
| 5,357,509 | 10/1994 | Ohizumi | 395/182.05 |
| 5,434,868 | 7/1995 | Aichelmann, Jr. et al. | 395/182.05 |
| 5,490,248 | 2/1996 | Dan et al. | 395/182.04 |
| 5,493,676 | 2/1996 | Amundson | 395/182.05 |
| 5,500,940 | 3/1996 | Skeie | 395/183.13 |
| 5,535,328 | 7/1996 | Harari et al. | 395/182.06 |
| 5,559,958 | 9/1996 | Farrand et al. | 395/184.01 |
| 5,566,316 | 10/1996 | Fechner et al. | 395/182.04 |
| 5,574,851 | 11/1996 | Rathunde | 395/182.05 |
| 5,574,856 | 11/1996 | Morgan et al. | 395/185.05 |
| 5,586,250 | 12/1996 | Carbonneau et al. | 395/183.2 |
| 5,611,069 | 3/1997 | Matoba | 395/182.04 |
| 5,615,330 | 3/1997 | Taylor | 395/182.05 |
| 5,617,530 | 4/1997 | Stallmo et al. | 395/182.04 |
| 5,632,013 | 5/1997 | Krygowski et al. | 395/182.05 |
| 5,657,439 | 8/1997 | Jones et al. | 395/182.06 |
| 5,666,482 | 9/1997 | McClure | 395/182.06 |
| 5,673,383 | 9/1997 | Sukegawa | 395/182.06 |
| 5,680,539 | 10/1997 | Jones | 395/182.04 |
| 5,740,397 | 4/1998 | Levy | 395/182.04 |

*Primary Examiner*—Robert W. Beausoliel, Jr.
*Assistant Examiner*—Pierre E. Elisca
*Attorney, Agent, or Firm*—Sharp, Comfort & Merrett, P.C.

[57] ABSTRACT

A computer system includes a memory subsystem with a failover memory adapted to replace a memory module in the main memory when the main memory module fails or experiences an unacceptable level of errors. Upon the detection of the fault condition, a hot swapping of information from the module in the main memory may be accomplished to a module in an auxiliary memory. A state machine may supervise the transfer such that information which may have been written to the faulty memory during the transfer can be subsequently provided to the auxiliary memory. In this way, a fault condition can be corrected without decreasing the available system memory and without necessitating rebooting.

41 Claims, 8 Drawing Sheets

FIG. 4
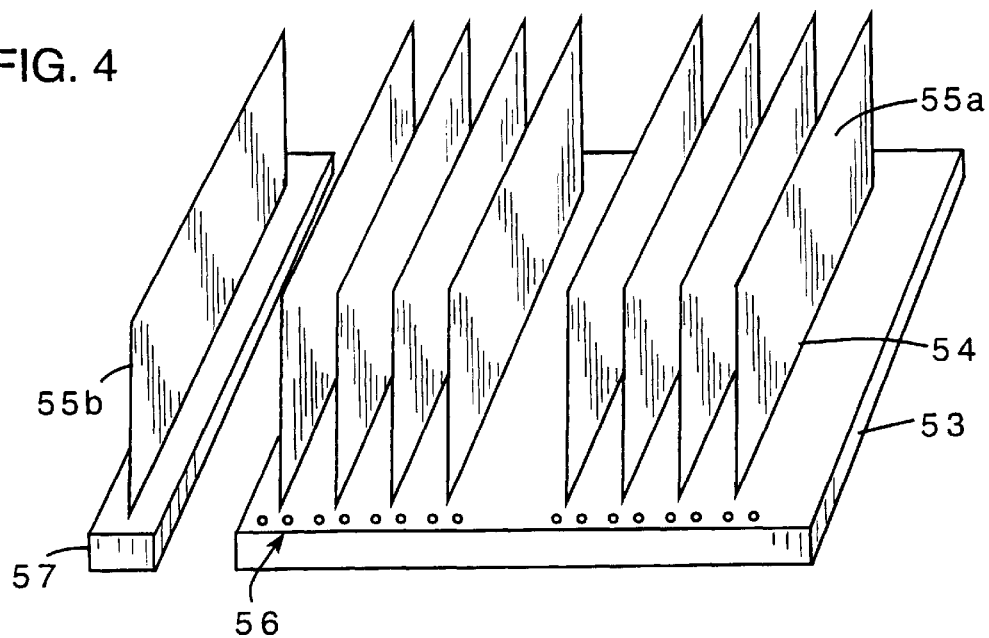
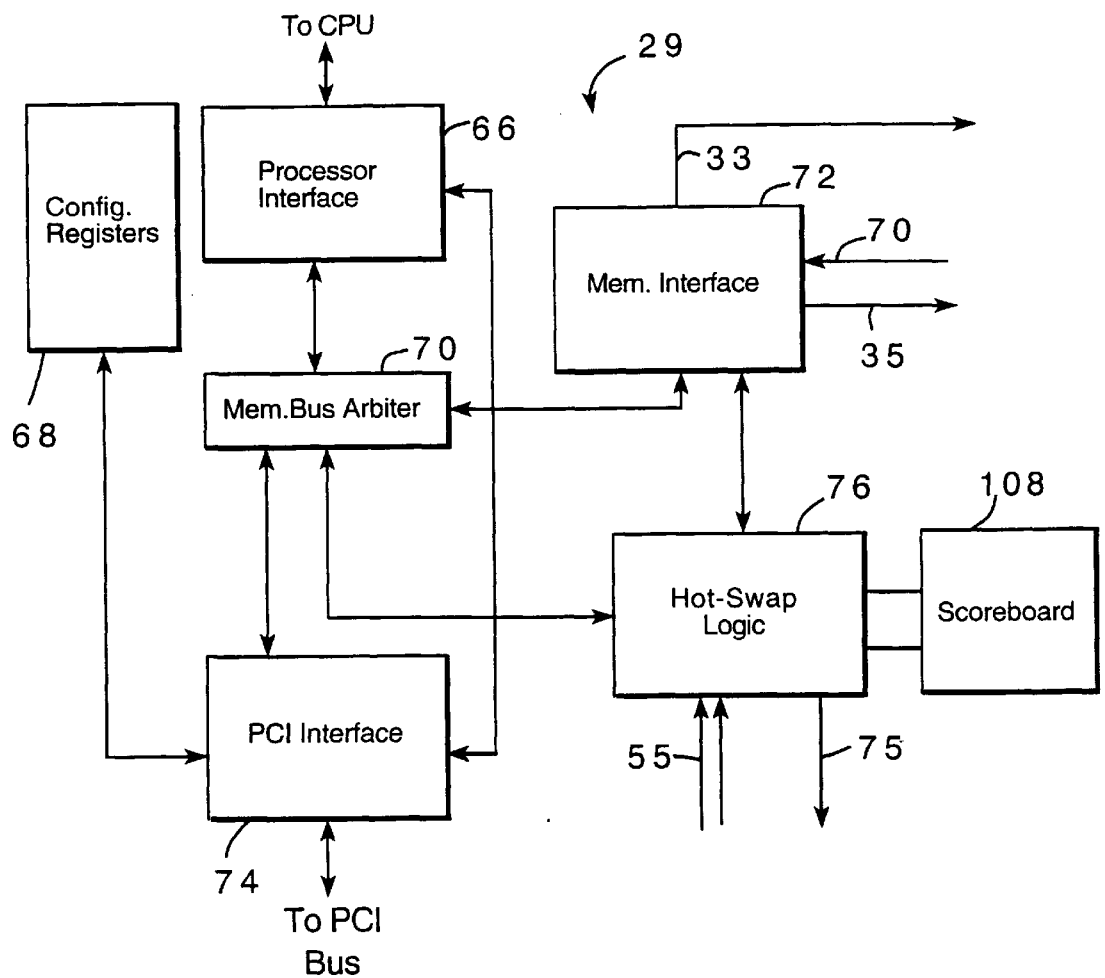
FIG. 5

FAILOVER MEMORY FOR A COMPUTER SYSTEM

FIELD OF THE INVENTION

This invention relates generally to microcomputer systems and particularly to memory subsystems utilized in connection with microcomputer systems.

BACKGROUND OF THE INVENTION

Microcomputer systems are being utilized for increasingly complex tasks. Software applications such as databases that run on these systems are also becoming more memory intensive. Larger, denser, and wider memory devices are now being utilized. At the same time, rapidly advancing technology enables central processing units and memory devices to run at very high clock speeds at lower voltages. As a result, the system environment noise is growing and the data is becoming more vulnerable to errors caused by transient electrical and electromagnetic phenomenon.

Personal computer users are now utilizing their systems in critical applications. As a result, microcomputer systems, such as servers, may include fault tolerant features such as hot plugability and failover capability. These features in turn can reduce system downtime or improve availability. Because of the demands placed on these personal computer systems, users are continually in search of systems that provide maximum data availability and integrity at competitive cost and performance.

Memories in conventional personal computers are usually dynamic random access memories or DRAMs provided in single inline memory modules called SIMMs or dual inline memory modules called DIMMs. Commonly, a number of such modules are utilized in a memory subsystem under the control of a memory controller. If one of these modules performs poorly, it can adversely affect the operation of the entire system. In fact, a single uncorrectable fault in a single memory module can cause the system to crash.

Memory device failures fall generally into two categories. The first is a soft error, which refers to those errors where data stored at a given memory location change, but where subsequent accesses can store the correct data to the same location with no more likelihood of returning incorrect data than from any other location. The second type of error is a hard error, which refers to those errors in which data can no longer reliably be stored at a given memory location. Either of these types of errors can lead to catastrophic failure of the memory subsystem.

To address these problems, computer systems may include error correcting code or ECC to detect and correct, when possible, memory errors. In addition, a fault prediction scheme used with an ECC may enable a system operator to predict the onset of a memory problem and to replace the memory before the problem occurs. For example, a monitor may record the number of ECC errors that are detected and when some threshold level is reached, the user may be advised of a potential future problem. The user might elect to replace a module at that time.

To attempt to overcome these problems a variety of techniques have been proposed. One such proposal is to mark a section of the memory as being faulty when it experiences an excessive number of errors or when uncorrectable errors arise. In this way, the system can restart without the faulty memory being mapped into address space. The problem with this approach is that the system needs to reboot in order to implement it. Moreover, after the reboot, the system has less memory to work with. Each fault requires a segment of memory, for example 128K, to be mapped out, progressively decreasing the available memory.

Another approach involves downshifting the number of port configurations when there is a hard memory failure on one of two memory ports. However, losing one half of the total memory has a severe impact on performance. Moreover, the downshifting approach also requires system rebooting.

It would be highly desirable to provide a system for overcoming defects at particular memory locations without decreasing the overall available system memory. Likewise, it would be desirable to enable such corrective action to occur without requiring the system to reboot. Similarly, it would be preferable to enable corrective action prior to a catastrophic failure.

SUMMARY OF THE INVENTION

In accordance with one aspect of the present invention, a computer system includes a processor and a memory controller connected to the processor and a memory connected to the controller. A connector for receiving an auxiliary memory unit is arranged for communication with the memory controller. The memory controller is adapted to communicate with the connector when a fault condition is detected with respect to the memory.

In accordance with another aspect of the present invention, a memory subsystem is described for a computer system including a processor and first and second memories. A controller is connectable to the processor and to the first and second memories. A detector which detects a fault condition in the first memory is connected to the controller. The controller is adapted to communicate with the second memory when a fault condition is detected by the detector.

In accordance with yet another aspect of the present invention, a computer system may include a processor and a memory controller connected to the processor. A first memory, including a plurality of modules, communicates with the memory controller. A second memory including at least one module is also provided. A detector detects a fault condition in one of the modules of the first memory. A controller, communicating with the detector, is adapted to substitute a module of the second memory for a module of the first memory when a fault condition is detected in the first memory module.

In accordance with still another aspect of the present invention, a method for correcting a memory fault in a computer system includes the step of providing an auxiliary memory which is not addressed until after a fault condition is detected. Once a fault condition is detected, data in the memory is transferred to the auxiliary memory. Thereafter, the auxiliary memory is addressed in place of the memory.

BRIEF DESCRIPTION OF THE DRAWING

FIG. 4 is a perspective view of the memory modules and connectors in accordance with one embodiment of the present invention;

FIG. 5 is a block diagram of the memory address controller shown in FIG. 2;

DETAILED DESCRIPTION OF THE PREFERRED EMBODIMENT

Figure 1:
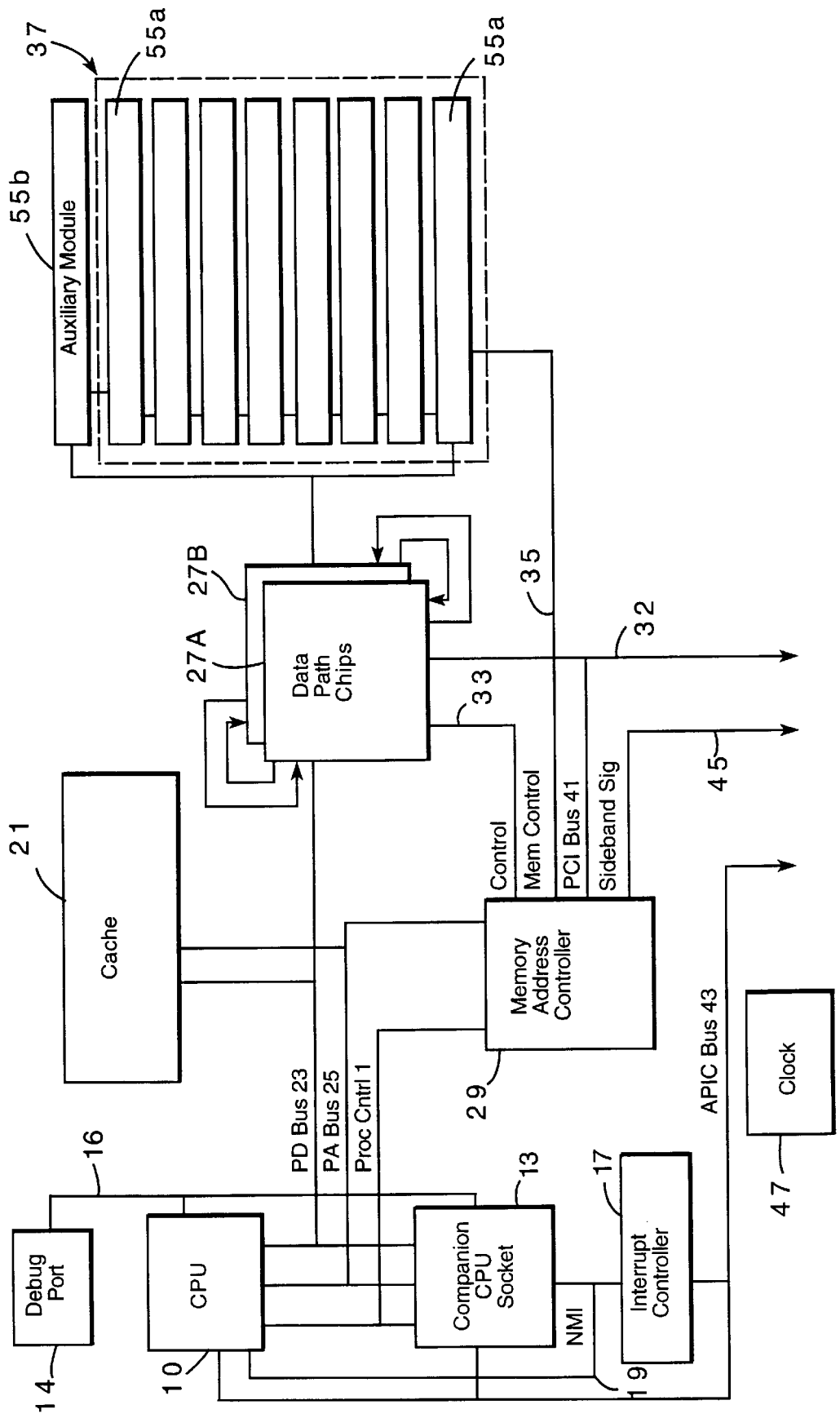
FIG. 1 is a block diagram of one embodiment of the present invention.

FIG. 1 is a block diagram representation of a processor and memory system in accordance with one embodiment of the present invention. The system comprises a processor 10, which could be the P54C processor available from Intel Corporation. A companion CPU socket 13 is also provided for dual processor implementations, and the socket could be implemented using the P54CM socket available from Intel. Both the processor 10 and companion CPU socket 13 communicate with a debug port 14 via a debug signal line 16 and with an interrupt controller 17 via a non-maskable interrupt (NMI) line 19.

On-board cache 21 is provided, for example by a 512K L2 cache, which communicates with the processor 10 via processor data (PD) bus 23 and processor address (PA) bus 25. The PD bus 23 may be 72 bits wide, and is also applied to two special purpose data path chips (27A, 27B). The memory address controller 29 communicates with PA bus 25 and also with processor control bus 31. The controller 29 provides control line 33 to chips 27A, 27B and also memory control line 35 to memory 37. The memory 37 may be implemented by eight 72 bit single inline memory modules 55a ("SIMMs"), for example, together with one auxiliary module 55b. However, dual inline memory modules ("DIMMs"), static random access memories ("SRAMs") or other types of memory may also be used in connection with the present invention. The peripheral component interface ("PCI") bus 41 and APIC bus 43 may be connected to a variety of components well known to those skilled in this art. Additional control signals are provided from the controller 29 via sideband signal line 45. A clock 47 provides system timing.

Figure 2:
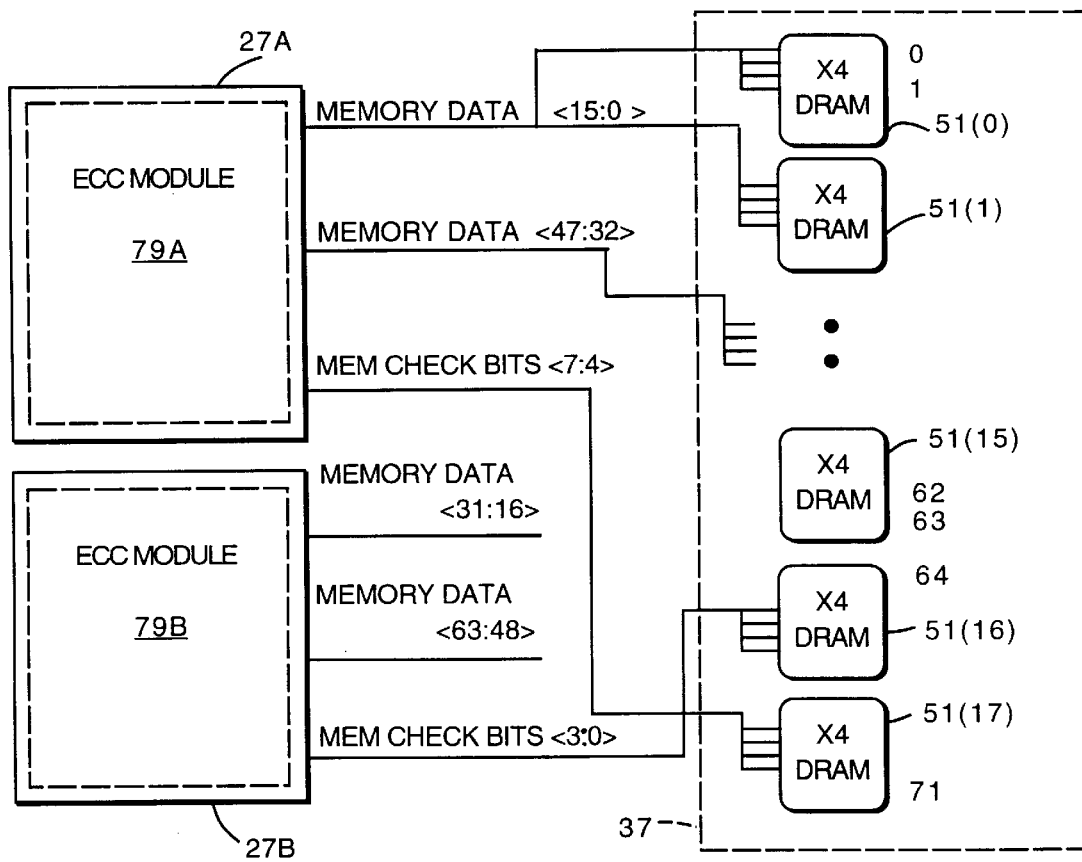
FIG. 2 is a block diagram showing a system for implementing a memory subsystem in accordance with one embodiment of the present invention.

Referring now to FIG. 2, an ECC module is implemented within each of the chips 27A, 27B. The modules 79 are identical, but one is designated as the initiator (79A) and the other as the target (79B). Modules 79A, 79B together may provide, for example, 64 bits of data and eight check bits to memory 37, implemented in the form of 18 X4 DRAM devices 51. For the sake of simplicity, only five of the DRAM devices are shown in FIG. 2 (DRAM 51(0), 52(1), and 51(15–17)). ECC initiator module 79A provides memory data bits 0–15 and 32–47 to X4 DRAMs 51(0–7), respectively. Module 79A also provides memory check bits 4–7 to X4 DRAM device 51(17). ECC target module 79B provides memory data bits 16–31 and 48–63 to X4 DRAM devices 51(8–15), respectively, and also provides memory check bits 0–3 to X4 DRAM device 51(16).

Figure 3:
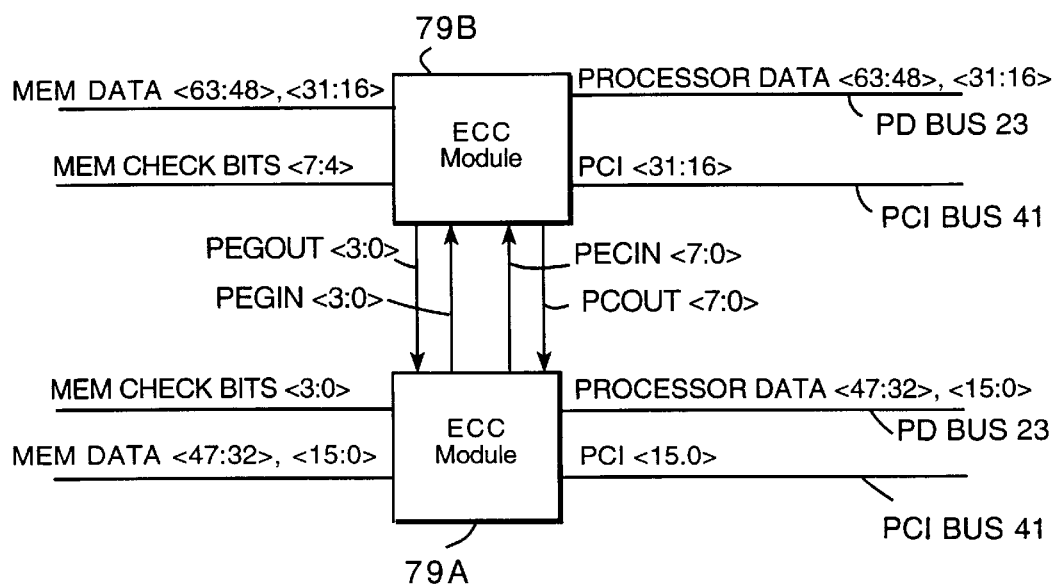
FIG. 3 is a block diagram of the ECC system in accordance with FIG. 2.

FIG. 3 is another diagram illustrating the interplay between ECC target module 79B and ECC initiator module 79A. The initiator module 79A receives processor data bits 0–15 and 32–47 from the PD bus 23. ECC target module 79B receives processor data bits 16–31 and 48–63, also from PD bus 23. The 32 bits of the PCI bus 41 are also split between the two modules, with bits 0–15 going to the initiator module 79A and bits 16–31 going to target module 79B. In order to generate the correct syndrome code, each ECC module may decode a total of 32 bits of data and four check bits. In addition, each module needs to provide the other with its own four check bits. Therefore, as shown in FIG. 3, each module drives the partial four check bits via PEGOUT<3:0> and receives the four partial check bits via PEGIN<3:0>. A total of eight pins are used to transfer partial check bits to generate proper syndrome/check bits. When an error is detected and is correctable, a total of eight syndrome bits must be transferred between the two modules. The syndrome bits are driven via PECOUT<7:0> and received via PECIN <7:0>.

If a single ASIC with sufficient capacity is available, this transfer of partial check bits and syndrome codes between the two modules 79, and the division of labor between the two modules, can be avoided. The choice of whether to use two ASICs or a single ASIC is driven primarily by cost considerations and the availability of large scale ASICs. Clearly, if a single ASIC is used, the design is simplified and there is some reduction in overhead since the exchange of partial check bits and syndrome codes is no longer necessary.

A variety of ECC schemes may be utilized. For example, the "Hamming codes" constitute one well-known class of ECCs and are widely used for error control in digital communications and data storage systems. A detailed description of the Hamming codes is found in Lin et al., "Error Control Coding, *Fundamentals and Applications*," Chapter 3 (1982). One subclass of the Hamming codes that is particularly well-suited for memory subsystems includes the single-error-correcting and double-error detecting (SEC-DED) codes. In these codes, the check bits are generated prior to data being written to memory using a parity-check matrix implemented in ECC hardware. In the (72, 64) Hamming code, eight check bits are generated for 64 bits of data. When a memory read occurs, the ECC hardware retrieves both the data and the corresponding check bits from memory. The ECC hardware then applies the parity check matrix to the data and the check bits, producing syndrome bits. If the syndrome bits are all zeros, this indicates there are no errors. If the syndrome bits contain ones, the data are possibly invalid. In the case of a single bit error, the syndrome bits indicate which bit is in error, and thus allow correction. In the case of double bit errors, the error will be detected, but correction is not possible.

Another well-known ECC is the "Reed-Solomon code," which is described in Hove et al., "Error Correction and Concealment in the Compact Disc System," *Philips Technical Review*, Vol. 40 (1980), No. 6, pages 166–172. The Reed-Solomon code is able to correct two errors per code word. Other conventional ECCs include the b-adjacent error correction code described in Bossen, "b-Adjacent Error Correction," IBM, J. Res. Develop., pp. 402–408 (July, 1970), and the odd weight column codes described in Hsiao, "A Class of Optimal Minimal Odd Weight Column SEC-DED Codes," *IBM J. Res. Develop.*, pp. 395–400 (July, 1970). The Hsiao codes, like the Hamming codes, are capable of detecting double bit errors and correcting single bit errors. The Hsiao codes use the same number of check bits as the Hamming codes (e.g., eight check bits for 64 bits of data), but are superior in that hardware implementation is simplified and the speed of error-detection is improved. Another ECC that is particularly advantageous for application to computer memory subsystems is described in co-pending and commonly assigned U.S. patent application Ser. No. 08/599,757, filed Feb. 12, 1996, entitled, "Error Codes," the disclosure of which is hereby incorporated by reference.

Referring to FIG. 5, the memory address controller 29 includes a processor interface 66, a configuration register 68, a memory bus arbiter 70, a memory interface 72, a PCI interface 74, and hot swap logic 76. The processor interface 76 decodes processor cycles, runs snoops to processor cache, and may include miscellaneous logic such as that necessary for soft reset and mode speed control. The interface 66 connects to the processor 10.

The memory interface 72 interacts with the memory 37 via memory address/control bus 35. It includes cycle control logic and interfaces with the data path chips 27 by providing control signals on the line 33 to control the data transfer to and from the memory 37. The memory interface 72 receives not only control logic but also decode information to generate RAS decodes and memory address generation. The interface 72 may also generate RAS negation conditions and page hit control. Memory addresses may be generated by multiplexing the processor or PCI generated address onto the memory address/control bus 35.

The PCI interface 74 may include a series of state machines which control the PCI interface. It may also include areas broken up to provide PCI initiator and PCI target modes. The PCI interface 74 communicates with the memory interface 72 and the processor interface 66 through a variety of control signals. The initiator interface runs when the processor 10 owns the PCI bus 41 and the target interface runs when a PCI initiator accesses the memory address controller 29 internal registers or system memory.

As illustrated in FIG. 4, the memory 37 may be implemented by a connector 53 which includes a plurality of slots 54 adapted to receive memory modules 55. For example, the slots 54 may be formed in a conventional module connector 53 adapted to receive card-like memory modules 55, which could be single inline memory modules or "SIMMs" or dual inline memory modules or "DIMMs." Each module 55a may have one or more associated indicators 56, which may be LEDs. An auxiliary connector 57 also includes a slot 54 which can receive a memory module 55b which may be of the same type as the module 55a. Advantageously, the capacity of the auxiliary module 55b is equal to the capacity of the largest capacity module 55a. Alternatively, memory modules 55 may be connected directly into the system motherboard (not shown) in which case the connectors 53, 57 would be part of the system motherboard.

Associated with each slot 54 and each module 55 is a pair of LEDs 56. Each LED of each pair 56 may be a differently colored LED. Alternatively, a single LED which is capable of implementing two different colors or three indicator states may be used in place of the pair 56. As another alternative, a blinking LED may be used to provide three indicator states (off, on, blinking).

The memory bus arbiter 70 handles arbitration between the various signals contained in the memory address controller 29 and controls the cycle of the interfaces 66, 72 and 74. The hot swap logic 76 includes a threshold register to accumulate the number of errors which occur at particular locations as reported by the ECC logic 79. The threshold register, in concert with the memory interface 72, may undertake a comparison of the number of errors that occur with a predetermined fault threshold. When the comparison indicates that the predetermined threshold has been exceeded, a signal is transmitted to the hot swap logic 76 to implement corrective action.

Figure 8:
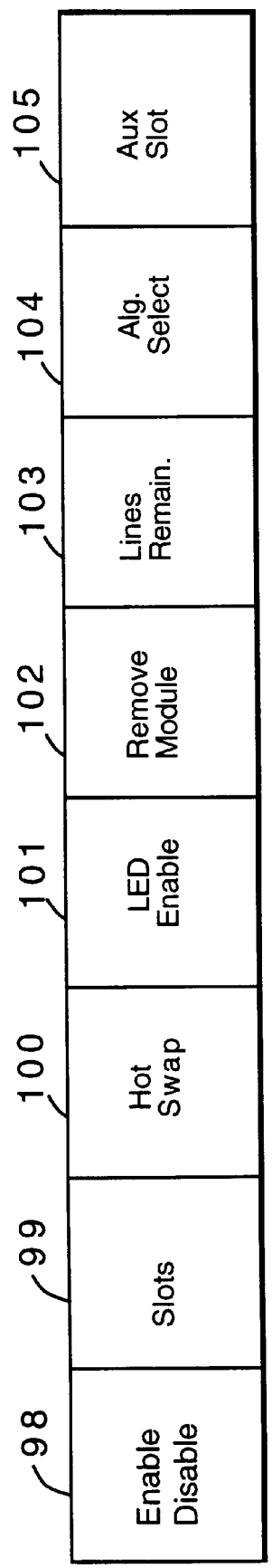
FIG. 8 illustrates the hot swap configuration register fields.

The register 68 maintains memory 37 status information. As shown in FIG. 8, the register 68 may include an enable/disable field 98 to indicate when the failover memory option is enabled. The slot field 99 contains bits for each memory slot 54 in the connector 53 so that the hot swap logic 76 can mask off faulty modules, as will be explained later. The hot swap "in progress" field 100 indicates whether a hot swap is in progress. The LED enable field 101 includes at least one bit for each slot 54 to enable or disable LEDs 56. The field 102 includes a bit to indicate whether a module 55 can be removed from the connector 54. The field 103 contains information on how many cache lines of memory remain to be transferred. The arbiter 70 uses this field to adjust the hot swap priority based on remaining cache lines to be transferred. The field 104 indicates which fault detection algorithm will be utilized. The field 105 may be used to allow the user to define which slot will be used as the slot for the auxiliary module 55b.

Hot swap logic 76, including a state machine, is utilized to implement a sequence of corrective actions in response to the detection of a given fault condition, for example, in a particular memory module 55b. When the ECC logic 79 indicates that the threshold level of errors has been exceeded or when the system has crashed, for example, due to an uncorrectable memory error, the problem module 55a is thereby identified and its location is stored in the logic 76. All control signals and address signals normally associated with the problem module 55a are then redirected to a module 55b in the auxiliary connector 57. In this way, a good module 55b in a connector 57 may be substituted for the problem module 55a and the problem module deactivated for subsequent replacement. By rerouting signals from the controller 29 to the auxiliary connector 57, a problem module 55a in the connector 53 can be eliminated and replaced.

The defective module 55a is located by interrogating the address log contained in the memory interface 72, for example, to determine the address that was being addressed when the failure occurred. The replacement information is then recorded in non-volatile memory, such as in the system BIOS, so that it is available when the system reboots. It is also advantageous to store information about the error history of particular memory locations in nonvolatile memory.

Eventually, for example, during routine system maintenance, the deactivated, problem module 55a may be located and replaced. The repair technician may notify the system software that the problem has been repaired and the BIOS may be instructed to make the appropriate corrections to return the system to the normal mode wherein only the slots 54 in the connector 53 are utilized.

Corrective action may be taken only after the system reboots. This could occur if hot swapping is not used, for example, because an uncorrectable error caused the system to crash. In this case, when the system reboots, a fast recovery mode is implemented. During the boot sequence, the BIOS interrogates to determine what memory location caused the crash to occur. That memory location is then masked off and the auxiliary memory is automatically used in its place. The bad memory module 55a could be identified to the user through the use of LEDs 56.

It is also possible to "hot swap" the auxiliary module for a problem module without rebooting. The hot swapping of modules may be accomplished in a variety of circumstances. For example, when threshold information in the register 68 indicates that a predetermined number of errors have occurred, the responsible module may be replaced. Ideally, the module may be replaced before a catastrophic failure causes system shut down. Alternatively, on the detection of an uncorrectable error, a hot swap operation may be initiated.

When a predetermined fault condition, such as those discussed above is detected, the memory address controller 29 operates the hot swap logic 76. The logic 76 then checks to determine whether a module is present in a connector 57. If so, the logic 76 signals the controller 29 to read the information from the problem module and to write the information into a module connected to the auxiliary connector 57.

Advantageously this swapping operation can be accomplished in most cases as a low priority operation. In other words, the swapping of information may occur when system requirements permit. However, the swapping operation system may have a priority where it is almost completed and a write to memory is about to be implemented, for example. This feature is implemented using the configuration field 103.

The memory bus controller handles its own arbitration for system memory through the arbiter 70. There are a variety of potential requesters for the memory bus, including processor write, processor read, I/O write, I/O read and refresh. Memory bus arbiter 70 may have a fixed priority with exceptions. The priority is generally in the following order from highest to lowest priority: (1) second refresh request, (2) processor write request, (3) processor read request, (4) I/O write request, (5) I/O read request, (6) hot swap if enabled, and (7) refresh. However, once a relatively small number of locations are left to be written to the auxiliary module 55b, the priority of the hot swap may be incremented by the memory bus arbiter 70. The hot swap might otherwise fail to complete for a long time.

A dual ported memory 108 acting as a "scoreboard" may be used in conjunction with the hot swap logic 76 to record information about any writes that occur in the course of a memory hot swap. The memory 108 records which memory locations have been transferred to the auxiliary module. When a memory write occurs during the hot swap process, which would have been implemented on the faulty module 51a, the corresponding scoreboard bit is reset. Thus, the hot swap logic 76 orders the re-transfer of the information in the corresponding location, since the hot swap logic 76 requires that all of the scoreboard bits be set before the hot swap is terminated.

Those skilled in the art will appreciate a variety of other techniques which may be utilized to accommodate for the possibility of a write operation during swapping, including delaying or posting the write operation, storing the write operation for later implementation, recording the write information in both the faulty module and the new module and the like. While a multiported memory 108 is illustrated herein, RAM or register files could be used as well, for example where there is a single memory bus that handles only one memory request.

The LEDs 56 may be utilized to indicate the condition of a memory module 55a and the need to replace that module. The LEDs 56 may be controlled by the logic 76 using the control line 75. In one embodiment, when both LEDs 56 are "off" the module 55a is in its normal or first state. The operation of the LEDs 56 in the second state (e.g. one "on", one "off") indicates that a module is faulty and that the hot swap is in progress. This warns the user not to remove the module 55a at that time. LEDs 56 in the third state (e.g. both LEDs "on") indicate that the module is bad, that the hot swap has been completed and it is now safe to remove the faulty module.

The register 68 stores the state of good and bad modules 55a in the field 101. That is, the configuration register 68 may store one status when all of the modules are operating appropriately and no effort has been made to replace one of the modules 55a in the connector 53. When a module connected to the connector 53 has been replaced, the status of the configuration register may be altered by the address controller 29.

Utility software can be used to inform the hardware that a faulty module has been replaced. When the system detects that a module has been removed, the user may be asked by the utility software whether the faulty module was replaced. If so, the system resets to the original memory configuration.

When a module 55a is removed from a slot 54, the card present signal on line 108 is removed. This is detected by the address controller 29 which changes the state of a bit in the configuration register field 99. The register 68 is checked to determine which slots 54 of which connector 53 or 57 should be addressed. After the register 68 is returned to its initial normal state, the address controller 29 returns to the normal operation and addresses only those slots contained in the connector 53. Conversely, so long as the register 68 records a fault condition, the module 55b contained in the connector 57 continues to be utilized even after being powered down.

A variety of fault replacement algorithms may be selected by the user, for example, by setting the appropriate bits in the algorithm field 104. In a first mode, a hot swap capability automatically shuts down a faulty module. After the system reboots, the auxiliary module is substituted. In a second mode, hot swap logic 76 evaluates which module has the most correctable faults. When a threshold level is exceeded, the module is replaced. In a third mode, the mean time between failures is calculated by summing the actual operating times of all memory units, including units that do not fail, and dividing that sum by the sum of all the failures of the units. When a unit of memory, such as a module 55, experiences faults at a level sufficiently below the calculated mean time between failures, it can be replaced. In a fourth mode of operation when an excessive number of hits have occurred over time to the same address, hot swapping can be initiated.

Figure 6:
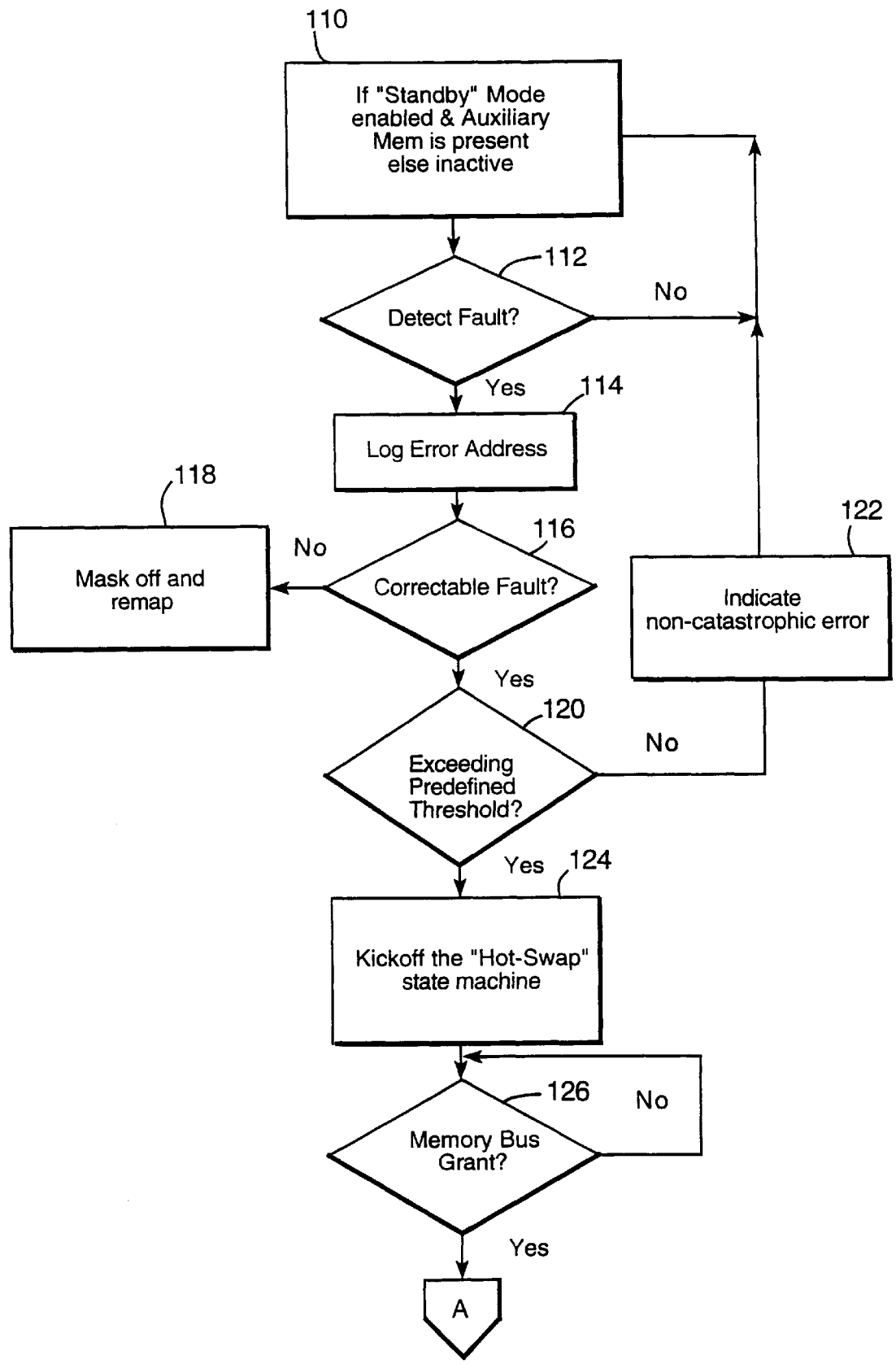
FIG. 6 is a flow chart for one exemplary fault detection protocol.

Referring now to FIG. 6, an exemplary flow for one embodiment is illustrated. Beginning at the block 110, a check is made to determine whether the auxiliary memory is present and whether the standby mode has been enabled. If so, in block 112, the system monitors for faults. If no faults have occurred, the system returns to block 110. If a fault has occurred, the address of the fault is logged, as shown in block 114.

At this point, the ECC logic 79 determines whether the fault is correctable, as shown in block 116. If not, as shown in block 118, system reboot may be required but, in any case, the faulty memory is then masked off and remapped with the auxiliary memory.

In block 120, it is determined whether a selected predefined fault threshold, such as one discussed above, has been exceeded. If not, an LED 56 may, for example, be operated to issue green, blinking light to indicate that a non-catastrophic error has occurred, as shown in block 122. The process flow then returns to block 110.

If the fault threshold has been exceeded, an amber LED 56, for example, is operated, to indicate a problem, and the hot swap logic 76 begins its operation. The hot swap logic 76 analyzes which module 55a needs to be replaced and then proceeds to implement that replacement, as will be described subsequently. If desired, an amber LED 56 may be operated to blink to indicate that the hot swapping process is in progress and that one should not remove the faulty module 55a.

In block 126, the hot swap logic 76 arbitrates for a bus grant. When it receives access to the bus, it begins the hot swapping algorithm.

Figure 7A:
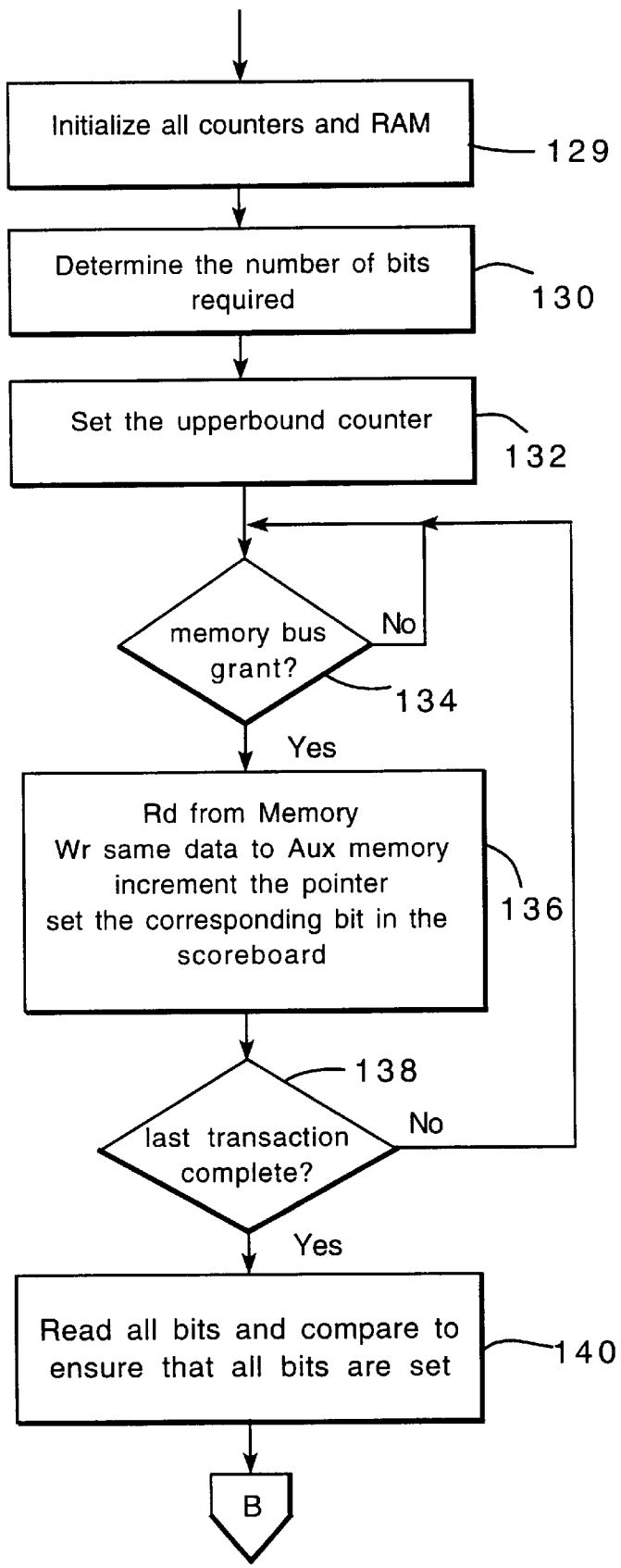
FIG. 7 (which is a combination of FIGS. 7a and 7b) is a flow chart for one exemplary implementation of a hot swapping protocol.
Figure 7B:
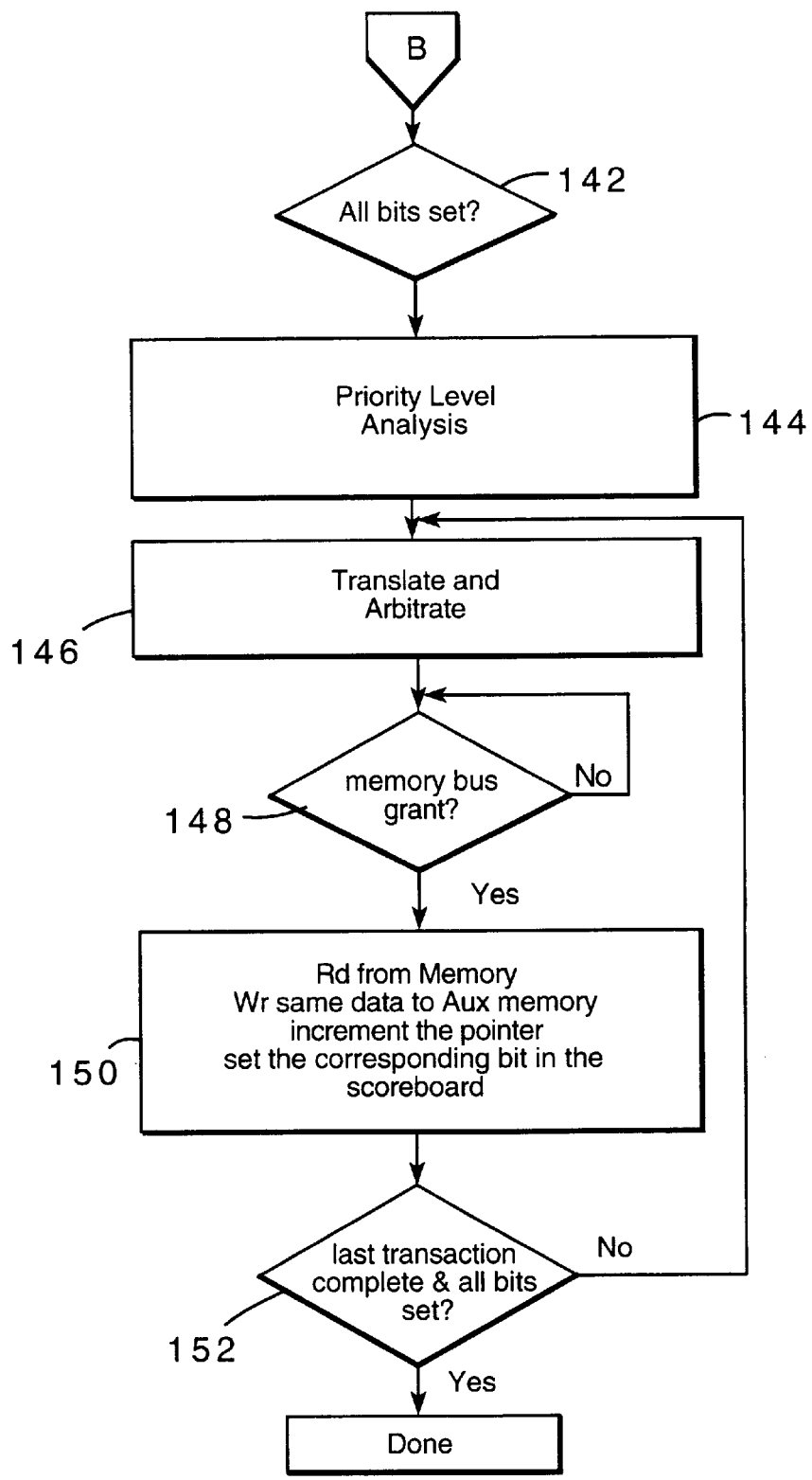

Referring to FIG. 7, the flow illustrated in FIG. 6 continues with the hot swapping protocol. A hot swap bit in the register field 98 is checked to determine whether or not hot swapping has been enabled, as illustrated. If so, all of the pertinent counters and memory are reset to zero, including the scoreboard memory 108. At block 130, the number of bits required for the scoreboard 108 is calculated. The number of megabytes in the faulty module is divided by the cache line size in bytes to determine the necessary number of bits.

An upper bound counter in the logic 76 is set with the number of transactions required to copy all of the data from the faulty memory, as indicated at step 132. This is determined in view of the calculation made in block 130.

In block 134, a check is made to determine whether the memory bus grant has been received. If not, the process waits. If the memory bus has been granted, the data in the faulty memory is read and the same data is written to the auxiliary memory. A pointer is incremented and the corresponding bit is set in the scoreboard 108, as indicated in block 136.

If that was the last transaction, all of the bits are read and compared to ensure that all of the scoreboard 108 bits had been set as shown in block 140. If not, the process cycles back to block 134.

A check is made to determine whether or not all of the scoreboard bits have been set, as shown at block 142. Next, the priority level of the hot swapping operation is analyzed to see if it should be increased. It is increased if the hot swapping operation is sufficiently close to termination that it would be inefficient to delay the swapping while other operations proceed. Since the hot swapping operation must continue to account for any write operations during the transition, it may be desirable to increase the priority of the hot swapping operation, as indicated in block 144. Any write transactions occurring during the swapping must be redone and a redo counter is set with the number of outstanding reset bits.

Any remaining scoreboard bits are then translated into a memory address and an arbitration for the memory bus is initiated. As shown in block 148, a memory bus grant request is issued and when granted, as shown in block 150, additional information is read from memory and written to the auxiliary memory to correct for any writes which occurred during the previous read and write operation to the auxiliary memory. A pointer is then incremented and the corresponding bit in the scoreboard 108 is set as indicated in block 150.

In block 152, a check is made to determine whether the last transaction is complete and whether all of the scoreboard bits have been set. If so, the hot swapping operation is completed. Otherwise, the protocol cycles back to block 146.

When all the scoreboard bits are set, the program proceeds to block 136 where the termination of the hot swap process may be indicated by stopping the blinking LED light, indicating that the faulty module can be removed. Once the transfer is complete, the faulty module is masked off and the memory address controller 29 directs the address/control signals to the auxiliary module in place of the faulty module. In this way, the auxiliary module is automatically hot swapped for the faulty module without necessitating system rebooting.

Figure 9:
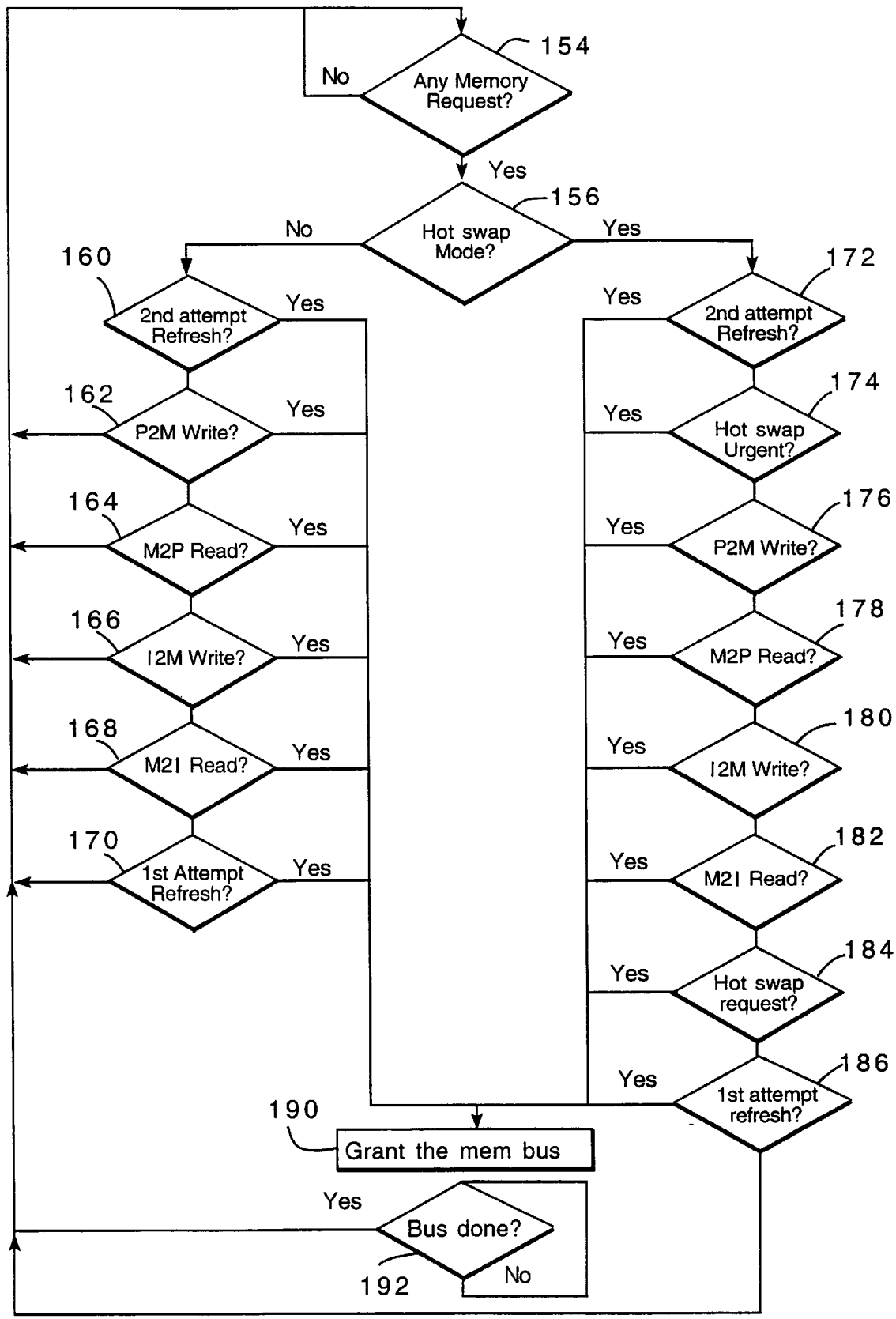
FIG. 9 is a flow chart for one exemplary memory bus arbitration protocol.

Referring to FIG. 9, the memory bus arbitration protocol starts with an inquiry in block 154 to determine whether there are any outstanding memory requests. If there are, an inquiry determines whether or not the hot swap mode has been selected, as illustrated in block 156. If not and if a second attempt at refresh is involved, which is the highest priority operation, the memory bus is granted, as shown in block 190. When the operation is complete, as indicated in block 192, the process returns to block 154.

If the operation was not a second refresh attempt, an inquiry is made to determine whether or not a processor write request is involved as indicated in block 162. If so, the memory bus is granted. If not, a determination is made in block 164 as to whether a processor read request is involved and again, the memory bus is granted if that is the case. Otherwise, in block 166, an inquiry is made to determine whether an I/O write request is involved and similarly, in 168, an inquiry is made to determine whether an I/O read request is involved. Finally, if the request is a first refresh attempt, the memory bus is granted if none of the other higher priority operations are in position.

The same protocol is implemented if the hot swap mode is implemented. Specifically, blocks 172, 176, 178, 180, 182, and 186 correspond and operate in the same way as the corresponding blocks in the non-hot swap mode. However, in block 174, an inquiry is made to determine whether hot swap is urgent. Hot swap would be urgent when there are a relatively few remaining memory locations to be transferred or when the transfer has been completed and all that remains is to go back and clear up any pending bits in the scoreboard. In this case, the hot swap may be incremented from the second to the lowest priority, as indicated by the block 184, to the second to the highest priority, second only to a second refresh request, as indicated in block 172. While in the illustrated embodiment the hot swap request is normally the second to the lowest priority and it may be incremented to the second to the highest priority under the indicated situations, those skilled in the art could vary the priority of the hot swap operation in normal circumstances and vary the incremented priority in accordance with specific situations. Through the capability to increase the priority of the hot swap operation, a potential live-lock scenario is avoided wherein the hot swap could never complete within any reasonable time frame because of inability to receive a bus grant.

The system may also be configured to allow the user to elect to disable the failover capability and to use the auxiliary memory as regular memory to increase the capacity of the subsystem. In this way, only those users that need the failover capability, would dedicate the auxiliary memory to implement the failover feature.

While the present invention has been described with respect to a limited number of embodiments, those skilled in the art will appreciate numerous modifications and variations therefrom. It is intended that the present invention should only be limited by the following claims.

I claim:

1. A computer system comprising:

a processor;

a memory controller coupled to said processor;

a volatile memory coupled to said controller;

an auxiliary volatile memory arranged for communication with said memory controller, said memory controller adapted to communicate with said auxiliary volatile memory when a fault condition is detected with respect to said volatile memory;

a device for transferring data stored on a defective portion of said volatile memory to said auxiliary volatile memory and for disabling the address of said defective portion of said volatile memory, without rebooting the system; and a scoreboard for tracking changes to said volatile memory and data transfer operations between said volatile memory and said auxiliary memory to indicate when all data has been transferred, wherein when all data has been transferred said volatile memory is available for removal without rebooting the computer.

2. The computer system of claim 1 including a detector for detecting a fault condition, said detector coupled to said controller.

3. The computer system of claim 2 wherein said detector includes an error correcting code device, said device adapted to determine when memory errors are occurring, said system further including a register for accumulating the number of errors identified by said error correcting code device, and for providing an indication when a preset limit has been exceeded, said detector indicating a fault condition to said memory controller when said predetermined level of errors has been exceeded.

4. The computer system of claim 1 including a memory for recording the address of a memory location where an error has occurred.

5. The computer system of claim 1 including a device for recording the number of times a given memory location is accessed and for indicating a fault condition when the number of accesses to any given memory location exceeds a predetermined level.

6. The computer system of claim 1 wherein said memory and said auxiliary memory are both composed of dynamic random access memory.

7. The computer system of claim 1 wherein said memory is composed of static random access memory.

8. The computer system of claim 1 wherein said transfer device is adapted to automatically transfer said data when a fault condition is detected without rebooting.

9. The computer system of claim 8 wherein said memory is composed of a plurality of memory modules and said auxiliary memory includes at least one memory module, said transfer device adapted to transfer information from one of said memory modules when a fault condition is detected in said module to said module in the auxiliary memory.

10. A computer system comprising:

a processor;

a memory controller coupled to said processor;

a first memory including a plurality of dynamic random access memory (DRAM) modules, said first memory communicating with said memory controller;

a second memory including at least one auxiliary DRAM module;

a detector for detecting a faulty memory module of said first memory; and a scoreboard for tracking when data is changed in the faulty memory module while data is being transferred between the faulty memory module and the auxiliary memory module to determine when all data has been transferred, wherein said memory controller is adapted to transfer data from said faulty memory module to said auxiliary memory module based on the scoreboard and substitute said auxilary memory module in place of said faulty memory module when all data is transferred.

11. The computer system of claim 10 wherein said controller is adapted to substitute a module of said second memory for a module of said first memory without rebooting after a fault condition is detected.

12. The computer system of claim 11 including a non-volatile memory for storing information about whether a module in said second memory has been substituted for a module in said first memory.

13. The computer system of claim 12 including a register for storing information about write operations which take place during the transfer of information from said module in said first memory to said module in said second memory, said memory controller adapted to correct said module of said second memory that was substituted for said module in said first memory to account for a write operation that occurred while said modules were being substituted for one another.

14. The computer system of claim 13 including a machine for automatically controlling the transfer between said modules of said first and second memories in response to the detection of a fault condition, and a device for monitoring whether a write operation occurs during said transfer and for transferring information that was the subject of said write operation into said module of said second memory.

15. A method for correcting a memory fault in a computer system, the method comprising the steps of:

providing an auxiliary memory which is not addressed until after a fault condition is detected, said auxiliary memory comprising a dynamic random access memory;

accumulating the number of correctable errors which occur in a portion of said memory, said memory comprising a dynamic random access memory;

determining that a fault exists when a predetermined level of errors has been detected;

transferring data in said memory to said auxiliary memory after a fault condition is detected;

tracking changes to said memory and transfer operations between said memory and said auxiliary memory after a fault condition is detected to determine when all data has been transferred from said memory; and addressing said auxiliary memory in place of said memory after a fault condition has been detected and after data has been transferred from said memory to said auxiliary memory.

16. The method of claim 15 wherein said step of detecting a fault condition includes the step of determining the mean time between failures in a plurality of memory locations and when the mean time between failures in a portion of said memory goes below a level, replacing that portion of said memory.

17. The method of claim 15 wherein said step of detecting a fault condition includes the step of determining the number of hits to the same address in the memory and when the number of hits exceeds a given threshold, indicating that a fault condition has been detected.

18. The method of claim 15 wherein said data is transferred automatically in response to the detection of a fault condition.

19. The method of claim 18 including the steps of producing a first indication when the memory is operating normally and providing a second indication to indicate that a fault condition has been detected.

20. The method of claim 19 including the step of providing a third indication to indicate that data is being transferred from the memory to the auxiliary memory.

21. The method of claim 15 including the step of recording the address of memory locations where faults have occurred.

22. The method of claim 15 including the steps of developing information that data has been transferred to the auxiliary module, and storing the information that data has been transferred to the auxiliary module in a nonvolatile memory such that each time said system is rebooted, the auxiliary memory is automatically addressed in place of the faulty memory.

23. The method of claim 15 wherein said memory and said auxiliary memory include memory modules, said method including the step of transferring, when a fault condition is detected, all of the data in a module containing the fault condition to the auxiliary memory module.

24. The method of claim 23 including the step of indicating which module in said memory has the fault condition.

25. The method of claim 24 including the steps of indicating when data is being transferred from one module to another.

26. The method of claim 23 including the step of automatically transferring data between said modules when a fault condition is detected, without rebooting the system.

27. The method of claim 26 including the step of recording information about the location of a memory write to the module containing the fault condition that occurs during the transfer of data to the auxiliary module.

28. The method of claim 27 including the step of checking to determine whether any write information has been recorded, correcting the auxiliary module for any such recorded information, and erasing the recorded information after the auxiliary module has been corrected.

29. The method of claim 28 including the step of re-checking to determine whether any write information has been recorded during the correcting step.

30. The method of claim 23 including the step of recording information about a write operation that occurred while data was being transferred.

31. The method of claim 30 including the step of correcting the information in said auxiliary module to account for information written while data was being transferred.

32. A method for correcting a dynamic random access memory fault in a computer system comprising the steps of:
providing an auxiliary memory which is not addressed until after a fault condition is detected, said auxiliary memory comprising a dynamic random access memory;
detecting a fault condition in a memory, said memory comprising a dynamic random access memory;
automatically transferring data in said memory to said auxiliary memory after a fault condition is detected;
tracking write operations to said memory and transfer operations between said memory and said auxiliary memory after a fault condition is detected to determine when all data has been transferred from said memory; and
addressing said auxiliary memory in place of said memory after a fault condition has been detected and after data has been transferred from said memory to said auxiliary memory.

33. A method for correcting a dynamic random access memory fault in a computer system comprising the steps of:
providing an auxiliary memory which is not addressed until after a fault condition is detected, said auxiliary memory comprising a dynamic random access memory;
automatically detecting a fault condition in a memory, said memory comprising a dynamic random access memory;
transferring data in said memory to said auxiliary memory after a fault condition is detected;
tracking write operations to said memory and transfer operations between said memory and said auxiliary memory after a fault condition is detected to determine when all data has been transferred from said memory;
addressing said auxiliary memory in place of said memory after a fault condition has been detected and after data has been transferred from said memory to said auxiliary memory;
producing a first user visible indication when the memory is operating normally; and
producing a second user visible indication to indicate that a fault condition has been detected.

34. The method of claim 33 including the step of providing a third indication to indicate that data is being transferred from the memory to the auxiliary memory.

35. The memory of claim 33 wherein said memory comprises at least one memory module and said auxiliary memory includes at least one auxiliary memory module, said method including the step of transferring, when a fault condition is detected, all of the data in a memory module containing the fault condition to an auxiliary memory module.

36. The method of claim 35 including the step of indicating which module in said memory has the fault condition.

37. The method of claim 36 including the step of indicating when data is being transferred from one module to another.

38. A method for correcting a dynamic random access memory fault in a computer system comprising the steps of:
providing an auxiliary memory module which is not addressed until after a fault condition is detected in one of a plurality of memory modules, said auxiliary memory comprising a dynamic random access memory;
detecting a fault condition in a memory, said memory comprising a dynamic random access memory;
transferring, when a fault condition is detected, all of the data in the one of said plurality of memory modules that contains the fault condition to an auxiliary memory module;
tracking write operations to said memory and transfer operations between said memory and said auxiliary memory after a fault condition is detected to determine when all data has been transferred from said memory;
addressing said auxiliary memory module in place of a memory module with a fault condition after a fault condition has been detected and after data has been transferred from said memory module to said auxiliary memory module; and
visibly indicating which memory module has the fault condition.

39. A method for correcting a memory fault in a computer system comprising the steps of:
providing an auxiliary memory which is not addressed until after a fault condition is detected, said auxiliary memory comprising a dynamic random access memory;

detecting a fault condition in a memory, said memory comprising a dynamic random access memory;

transferring data in said memory to said auxiliary memory after a fault condition is detected;

tracking write operations to said memory and transfer operations between said memory and said auxiliary memory after a fault condition is detected to determine when all data has been transferred from said memory;

addressing said auxiliary memory in place of said memory after a fault condition has been detected and after data has been transferred from said memory to said auxiliary memory; and indicating when data is being transferred from said memory to said auxiliary memory.

40. A method for correcting a dynamic random access memory memory fault in a computer system comprising the steps of:

providing an auxiliary memory which is not addressed until after a fault condition is detected, said auxiliary memory comprising a dynamic random access memory;

automatically transferring data in said memory to said auxiliary memory after a fault condition is detected, said memory comprising a dynamic random access memory;

tracking write operations to said memory and transfer operations between said memory and said auxiliary memory after a fault condition is detected to determine when all data has been transferred from said memory;

addressing said auxiliary memory in place of said memory after a fault condition has been detected and after data has been transferred from said memory to said auxiliary memory; and assigning a first priority to said automatic data transfer and incrementing said priority under certain circumstances.

41. The method of claim 40 including the step of incrementing the priority of the automatic data transfer when the data transfer is partially completed.

* * * * *